United States Patent
Xun et al.

(10) Patent No.: US 10,032,803 B2
(45) Date of Patent: Jul. 24, 2018

(54) THIN FILM TRANSISTOR ARRAY PANEL AND METHOD FOR MANUFACTURING THE SAME

(71) Applicant: SAMSUNG DISPLAY CO., LTD., Yongin-si, Gyeonggi-Do (KR)

(72) Inventors: Zhu Xun, Suwon-si (KR); Jae Woo Park, Seongnam-si (KR); Jae Won Song, Seoul (KR); Keum Hee Lee, Goyang-si (KR); June Whan Choi, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 15/343,780

(22) Filed: Nov. 4, 2016

(65) Prior Publication Data
US 2017/0053940 A1 Feb. 23, 2017

Related U.S. Application Data
(62) Division of application No. 14/466,317, filed on Aug. 22, 2014, now Pat. No. 9,515,093.

(30) Foreign Application Priority Data
Jan. 10, 2014 (KR) .................... 10-2014-0003548

(51) Int. Cl.
*H01L 21/00* (2006.01)
*H01L 31/00* (2006.01)
(Continued)

(52) U.S. Cl.
CPC .......... *H01L 27/124* (2013.01); *H01L 21/443* (2013.01); *H01L 21/76852* (2013.01);
(Continued)

(58) Field of Classification Search
CPC ......... H01L 27/12; H01L 21/44; H01L 21/07; H01L 29/66; H01L 29/78; H01L 29/45
(Continued)

(56) References Cited

U.S. PATENT DOCUMENTS 7,105,868 B2 9/2006 Nause et al.
7,211,825 B2 5/2007 Shih et al.
(Continued)

FOREIGN PATENT DOCUMENTS

JP 2009170769 7/2009
JP 2011082380 4/2011
(Continued)

*Primary Examiner* — Sheikh Maruf
(74) *Attorney, Agent, or Firm* — F. Chau & Associates, LLC

(57) ABSTRACT

A thin film transistor array panel is provided as follows. A gate electrode is disposed on a substrate. A semiconductor layer is disposed on the gate electrode. A gate insulating layer is disposed between the gate electrode and the semiconductor layer. A source electrode is disposed on a first side of the semiconductor layer, having a first lateral surface. A drain electrode is disposed on a second side of the semiconductor layer, having a second lateral surface. The first and second lateral surfaces define a spacing which overlaps the gate electrode. A metal suicide layer is disposed on the first and second lateral surfaces. A passivation layer is disposed on the metal silicide layer, the source electrode and the drain electrode. The passivation layer is not in contact with the first and second lateral surfaces.

10 Claims, 20 Drawing Sheets

(51) Int. Cl.

| | | |
|---|---|---|
| *H01L 27/12* | (2006.01) | |
| *H01L 29/417* | (2006.01) | |
| *H01L 21/443* | (2006.01) | |
| *H01L 29/45* | (2006.01) | |
| *H01L 29/66* | (2006.01) | |
| *H01L 29/786* | (2006.01) | |
| *H01L 21/768* | (2006.01) | |
| *H01L 23/532* | (2006.01) | |
| *G02F 1/1335* | (2006.01) | |
| *G02F 1/1368* | (2006.01) | |

(52) U.S. Cl.
CPC ........ H01L 27/127 (2013.01); H01L 27/1225 (2013.01); H01L 27/1259 (2013.01); H01L 29/41733 (2013.01); H01L 29/458 (2013.01); H01L 29/66765 (2013.01); H01L 29/7869 (2013.01); H01L 29/78618 (2013.01); *G02F 1/1368* (2013.01); *G02F 1/133512* (2013.01); *G02F 1/133514* (2013.01); *G02F 2001/133519* (2013.01); *G02F 2201/121* (2013.01); *G02F 2201/123* (2013.01); *H01L 23/53238* (2013.01); *H01L 27/1288* (2013.01); *H01L 2924/0002* (2013.01)

(58) Field of Classification Search
USPC ................ 257/43, 59; 438/85, 86, 104, 754
See application file for complete search history.

(56) References Cited

U.S. PATENT DOCUMENTS

| | | | |
|---|---|---|---|
| 7,790,617 B2 | 9/2010 | Lim et al. | |
| 8,313,980 B2 | 11/2012 | Akimoto | |
| 8,389,417 B2 | 3/2013 | Yamazaki et al. | |
| 8,410,002 B2 | 4/2013 | Yamazaki et al. | |
| 2002/0149016 A1 | 10/2002 | Yamazaki et al. | |
| 2004/0195573 A1 | 10/2004 | Kim | |
| 2005/0285233 A1 | 12/2005 | Huang et al. | |
| 2006/0113549 A1 | 6/2006 | Den et al. | |
| 2008/0068537 A1 | 3/2008 | Lee et al. | |
| 2008/0296568 A1 | 12/2008 | Ryu et al. | |
| 2008/0318368 A1 | 12/2008 | Ryu et al. | |
| 2009/0218568 A1* | 9/2009 | Dairiki ................... H01L 29/04 257/57 |
| 2010/0051936 A1* | 3/2010 | Hayashi .............. H01L 27/1225 257/43 |
| 2010/0084648 A1 | 4/2010 | Watanabe | |
| 2010/0148176 A1 | 6/2010 | Son et al. | |
| 2011/0175087 A1* | 7/2011 | Yamazaki .......... H01L 21/8221 257/57 |
| 2011/0193077 A1* | 8/2011 | Yamazaki ......... H01L 21/02554 257/43 |
| 2011/0227074 A1* | 9/2011 | Kato .................... H01L 27/0688 257/57 |
| 2011/0242464 A1 | 10/2011 | Kawasaki | |
| 2011/0272699 A1 | 11/2011 | Akimoto et al. | |
| 2011/0298027 A1* | 12/2011 | Isobe ................. G11C 16/0433 257/296 |
| 2012/0068173 A1* | 3/2012 | Umezaki ................ G09G 3/342 257/43 |
| 2012/0074407 A1* | 3/2012 | Yamazaki ........... H01L 27/0688 257/57 |
| 2012/0097960 A1 | 4/2012 | Yamazaki | |
| 2012/0104385 A1 | 5/2012 | Godo et al. | |
| 2012/0119211 A1* | 5/2012 | Lin .................... H01L 29/78606 257/57 |
| 2012/0187410 A1* | 7/2012 | Yamazaki ........... H01L 27/0688 257/66 |
| 2012/0223300 A1* | 9/2012 | Kang ................ H01L 29/41733 257/43 |
| 2012/0223315 A1 | 9/2012 | Uemura et al. | |
| 2013/0001565 A1* | 1/2013 | Jung ................. H01L 29/42384 257/59 |
| 2013/0228756 A1 | 9/2013 | Lee | |
| 2014/0151688 A1* | 6/2014 | Yamazaki ........... H01L 29/7869 257/43 |
| 2014/0240632 A1* | 8/2014 | Kim .................... H01L 27/1288 349/43 |
| 2014/0284597 A1* | 9/2014 | Shimomura ........ H01L 29/7869 257/43 |
| 2014/0340608 A1* | 11/2014 | Yamazaki ............. G02F 1/1368 349/47 |
| 2015/0123118 A1* | 5/2015 | Yeom .................. H01L 29/7869 257/43 |
| 2015/0200212 A1 | 7/2015 | Xun et al. | |
| 2016/0172383 A1* | 6/2016 | Nagatsuka .......... H01L 27/1225 257/43 |

FOREIGN PATENT DOCUMENTS

| | | | | |
|---|---|---|---|---|
| JP | WO 2011096263 A1 * | 8/2011 | ....... | H01L 21/02554 |
| JP | 2013-103708 | 5/2013 | | |
| JP | 2013103708 | * 5/2013 | | |
| KR | 1020120138074 | 12/2012 | | |
| KR | 1020130126240 | 11/2013 | | |
| WO | 2011096263 | 8/2011 | | |

* cited by examiner

THIN FILM TRANSISTOR ARRAY PANEL AND METHOD FOR MANUFACTURING THE SAME

CROSS-REFERENCE TO RELATED APPLICATION

This application is a divisional of U.S. application Ser. No. 14/466,317 filed on Aug. 22, 2014, which claims priority under 35 U.S.C. § 119 to Korean Patent Application No. 10-2014-0003548, filed on Jan. 10, 2014 in the Korean Intellectual Property Office, the disclosure of which is incorporated by reference herein in its entirety.

TECHNICAL FIELD

The present invention relates to a thin film transistor array panel and a manufacturing method thereof.

DESCRIPTION OF THE RELATED ART

Displays such as a liquid crystal display (LCD), an organic light emitting diode (OLED) display, and the like include multiple pairs of electric field generating electrodes and an electro-optical active layer interposed therebetween. The liquid crystal display includes a liquid crystal layer as the electro-optical active layer, and the organic light emitting display includes an organic light emitting layer as the electro-optical active layer.

Field generating electrodes are connected to switching elements to receive electrical signals, and the electro-optical active layer converts the electrical signals into optical signals to display an image. Such switching elements include thin film transistors. The thin film transistors include a gate line transferring a scanning signal for controlling the thin film transistor, a data line transferring a signal applied to a pixel electrode.

As a displaying area of display devices becomes larger, faster propagation of the signals across the displaying area is required.

SUMMARY

According to an exemplary embodiment of the present invention, a thin film transistor array panel is provided as follows. A gate electrode is disposed on a substrate. A semiconductor layer is disposed on the gate electrode. A gate insulating layer is disposed between the gate electrode and the semiconductor layer. A source electrode is disposed on a first side of the semiconductor layer, having a first lateral surface. A drain electrode is disposed on a second side of the semiconductor layer, having a second lateral surface. The first and second lateral surfaces define a spacing which overlaps the gate electrode. A metal silicide layer is disposed on the first and second lateral surfaces. A passivation layer is disposed on the metal silicide layer, the source electrode and the drain electrode. The passivation layer is not in contact with the first and second lateral surfaces.

According to an exemplary embodiment of the present invention, a method of manufacturing a thin film transistor array panel is provided as follows. A gate electrode is formed on a substrate. A semiconductor layer is formed on the substrate and the gate electrode. A gate insulating layer is formed between the gate electrode and the semiconductor layer. Source and drain electrodes are disposed on first and second sides of the gate electrode. The source and drain electrodes include a metal element. A silane ($SiH_4$) material layer is formed on the source and drain electrodes. A passivation layer is formed on the source and drain electrodes. The forming of the passivation layer causes an silicidation process. The silicidation process includes a reaction between silicon of the silane ($SiH_4$) material layer and the metal element of the source and drain electrodes thereby forming a metal silicide layer on first and second lateral sides of the source and drain electrodes. The first and second lateral sides define a spacing that overlaps the gate electrode. The first and second lateral sides are in contact with the metal silicide layer without being in contact with the passivation layer.

BRIEF DESCRIPTION OF THE DRAWINGS

These and other features of the present invention will become more apparent by describing exemplary embodiments thereof with reference to the accompanying drawings of which.

DETAILED DESCRIPTION OF EXEMPLARY EMBODIMENTS

Figure 1:
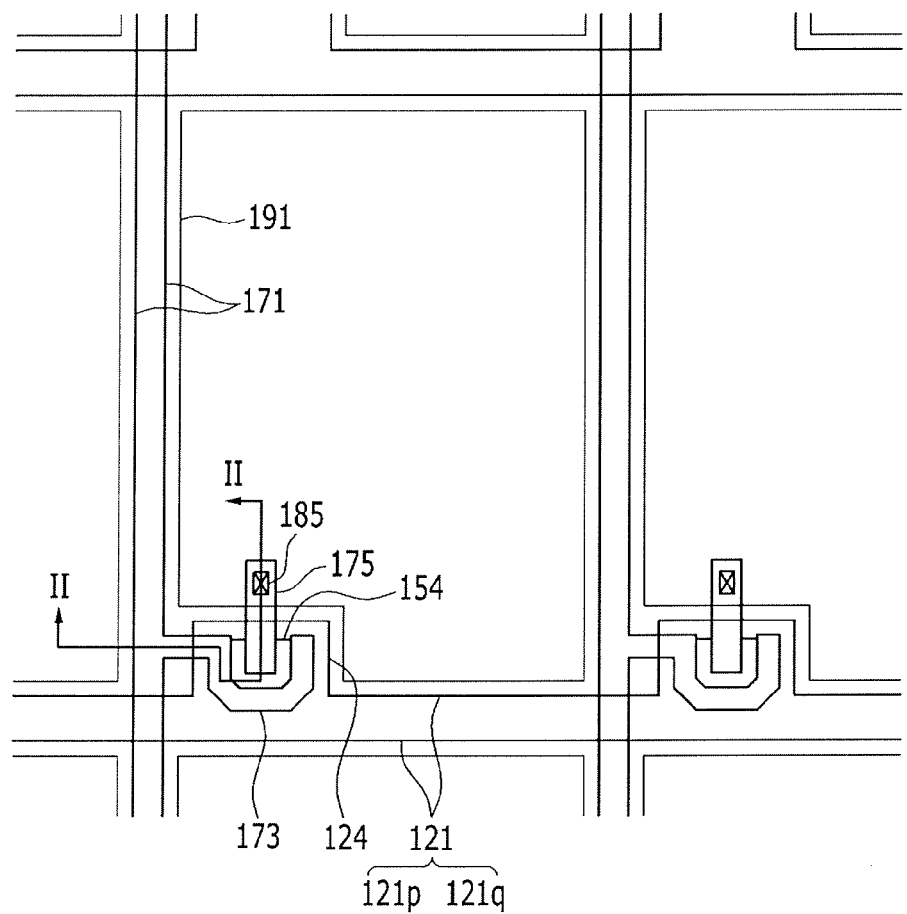
FIG. 1 is a top plan view of a thin film transistor array panel according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2:
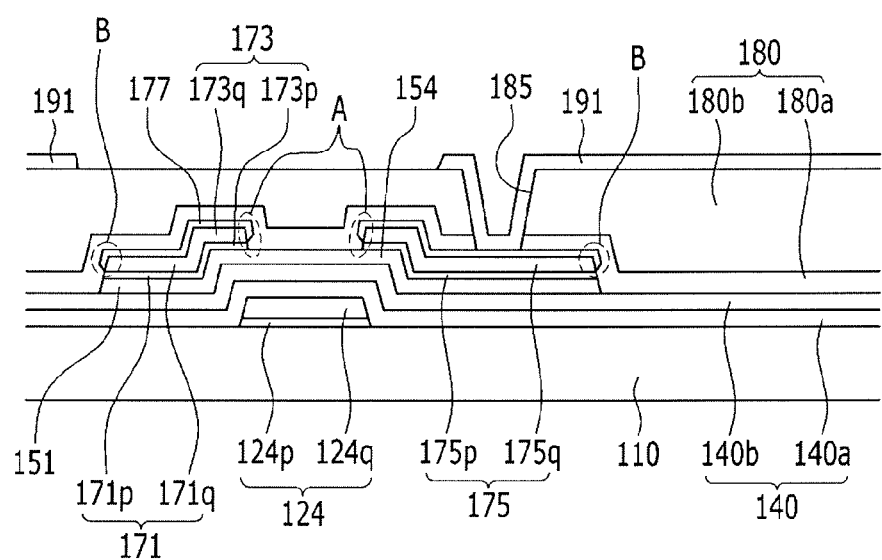
FIG. 2 is a cross-sectional view taken along line II-II of FIG. 1.

FIG. 1 is a top plan view of a thin film transistor array panel according to an exemplary embodiment of the present invention. FIG. 2 is a cross-sectional view taken along line II-II of FIG. 1.

Referring to FIG. 1 and FIG. 2, the thin film transistor array panel 100 includes gate lines 121 formed on an insulation substrate 110 formed of transparent glass or plastic.

The gate lines 121 transmit a gate signal and extend in a transverse direction. Each gate line 121 includes gate electrodes 124 protruding from the gate line 121.

The gate line 121 and the gate electrode 124 may have a dual-layer structure having first layers 121p and 124p and second layers 121q and 124q. Each of the first layers 121p and 124p and the second layers 121q and 124q may be formed of an aluminum-based metal such as aluminum (Al) and an aluminum alloy, a silver-based metal such as silver (Ag) and a silver alloy, a copper-based metal such as copper (Cu) and a copper alloy, a molybdenum-based metal such as molybdenum (Mo) and a molybdenum alloy, chromium (Cr), titanium (Ti), tantalum (Ta), manganese (Mn), or the like. For example, the first layers 121p and 124p may include titanium, and the second layers 121q and 124q may include copper or a copper alloy.

Alternatively, the first layers 121p and 124p and the second layers 121q and the 124q may be formed of a combination of films having different physical properties. The gate line 121 and the gate electrode 124 include two layers, but are not limited thereto, and may be formed as a single layer or three layers.

A gate insulating layer 140 formed of an insulating material such as a silicon oxide or a silicon nitride is positioned on the gate line 121. The gate insulating layer 140 may include a first insulating layer 140a and a second insulating layer 140b. The first insulating layer 140a may be formed of a silicon nitride ($SiN_x$) with a thickness of about 4000 Å, and the second insulating layer may be formed of a silicon oxide ($SiO_x$) with a thickness of about 500 Å. Alternatively, the first insulating layer 140a may be formed of a silicon oxynitride (SiON), and the second insulating layer 140b may be formed of a silicon oxide ($SiO_x$). The gate insulating layers 140a and 140b include two layers, but may include a single layer.

Semiconductor layers 151 are formed on the gate insulating layer 140. The semiconductor layers 151 may be formed of amorphous silicon, crystalline silicon, or an oxide semiconductor. The semiconductor layers 151 extend primarily in a vertical direction and include projections 154 that protrude toward the gate electrode 124.

When the semiconductor layer 151 is formed of an oxide semiconductor, the semiconductor layer 151 contains at least one of zinc (Zn), indium (In), tin (Sn), gallium (Ga), and hafnium (Hf). For example, The semiconductor layer 151 may be an indium-gallium-zinc oxide.

Data lines 171, source electrodes 173 connected to the data lines 171, and drain electrodes 175 are formed on the semiconductor layer 151 and the gate insulating layer 140. The data lines 171 transfer data signals and extend primarily in the vertical direction to cross the gate lines 121. The source electrode 173 may extend from the data line 171. The source electrode 173 may overlap the gate electrode 124. The source electrode 173 may be substantially U-shaped.

The drain electrode 175 is separated from the data line 171 and extends upward from the center of the "U" shape of the source electrode 173.

The data line 171, the source electrode 173, and the drain electrode 175 have a dual-film structure of barrier layers 171p, 173p, and 175p and main wiring layers 171q, 173q, and 175q. The barrier layers 171p, 173p, and 175p are formed of a metal oxide and the main wiring layers 171q, 173q, and 175q are formed of copper or the copper alloy.

For example, the barrier layers 171p, 173p, and 175p may be formed of one of an indium-zinc oxide, a gallium-zinc oxide, and an aluminum-zinc oxide.

The barrier layers 171p, 173p, and 175p serve to prevent the material such as copper or the like from being diffused to the semiconductor layer 151.

A metal silicide layer 177 is positioned on the main wiring layers 171q, 173q, and 175q. The metal silicide layer 177 includes copper, silicon, and oxygen, and for example, may include a compound represented by $CuSi_xO_y$. The metal silicide layer 177, covering the source electrode 173 and the drain electrode 175, is in contact with the surface of the source electrode 173 and the drain electrode 175. For example, the metal silicide layer 177 covers exposed lateral surfaces A and B of the source electrode 173 and the drain electrode 175 and exposed upper surfaces of the source electrode 173 and the drain electrode 175. The metal silicide layer 177 is not in contact with the gate insulating layer 140.

Hereafter, the exposed later surface A of the source electrode 173 and the drain electrode 175 near the channel region of the semiconductor layer 151 will be described.

Referring to FIG. 2, the projection 154 of the semiconductor layer 151 includes a portion that is not covered by the data line 171, the source electrode 173 and the drain electrode 175. For example, the portion of the projection is exposed between the source electrode 173 and the drain electrode 175. The data line 151, the source electrode 173 and the drain electrode 175 are stacked on the semiconductor layer 151. The portion of the projection in the semiconductor layer 151 is exposed between the source and drain electrodes 173 and 175. The edge of the semiconductor layer 151 is vertically aligned with outer edges of the data line 171 and the drain electrode 175. Inner edges of the source and drain electrodes 173 and 175 defines the exposed portion of the projection 154. The edges of the data line 171, the source electrode 173 and the drain electrode 175 may be vertically sloped.

One gate electrode 124, one source electrode 173, and one drain electrode 175 form one thin film transistor (TFT) along with the projection 154 of the oxide semiconductor layer 151, and the channel of the thin film transistor is formed in the projection 154 between the source electrode 173 and the drain electrode 175.

Lateral surfaces of the source electrode 173 and the drain electrode 175 adjacent to the channel region are exposed, and exposed lateral parts A of the source electrode 173 and the drain electrode 175 are covered by the metal silicide layer 177. If the lateral parts A of the source electrode 173 and the drain electrode 175 is exposed without the metal silicide layer 177, if a following process forming the passivation layer including a silicon oxide is performed or a heat treatment to provide a channel characteristic to the protrusion 154 of the semiconductor layer is performed, the material such as copper included in the main wiring layers 171q, 173q, and 175q forms an porous oxide such that the thin film transistor characteristic may be decreased.

Accordingly, the metal suicide layer may prevent the material such as copper or the like from being oxidized in performing subsequent processes such as forming the passivation layer and performing the heat treatment.

The metal suicide layer 177 may formed using two step processes including forming a silane material layer and performing a silicidation process using the silane material layer. Detailed descriptions will be made later with reference to FIGS. 8-10. A passivation layer 180 is formed on the metal silicide layer 177. The passivation layer 180 is formed of an inorganic insulator such as a silicon nitride or a silicon oxide, an organic insulator, or a low-dielectric insulator.

The passivation layer 180 may include a lower passivation layer 180a and an upper passivation layer 180b. The lower passivation layer 180a may be formed of a silicon oxide and the upper passivation layer 180b may be formed of a silicon nitride.

Since the semiconductor layer 151 includes an oxide semiconductor, the lower passivation layer 180a adjacent to the semiconductor layer 151 is formed of a silicon oxide. When the lower passivation layer 180a is formed of a silicon nitride, the semiconductor layer 151 does not serve as a channel region of a thin film transistor.

The passivation layer 180 be in contact with the exposed part that is not covered by the source electrode 173 and the drain electrode 175 between the source electrode 173 and the drain electrode 175.

Contact holes 185 that expose one end of the drain electrodes 175 are formed on the passivation layer 180. Pixel electrodes 191 are formed on the passivation layer 180. The pixel electrode 191 is physically and electrically connected with the drain electrode 175 through the contact hole 185, and is applied with data voltage from the drain electrode 175.

The pixel electrode 191 may be formed of a transparent conductor such as ITO (Indium Tin Oxide) or IZO (Indium Zinc Oxide).

FIG. 3 to FIG. 10 are cross-sectional views illustrating a method for manufacturing a thin film transistor array panel according to an exemplary embodiment of the present invention. FIG. 3 to FIG. 10 sequentially illustrate the cross-sectional views taken along line II-II of FIG. 1.

Figure 3:
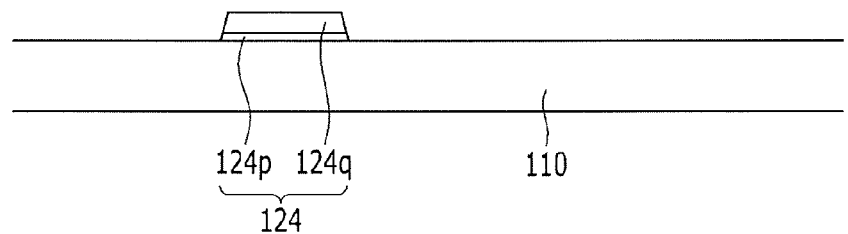
FIG. 3 to FIG. 10 are cross-sectional views showing a manufacturing method of a thin film transistor array panel according to an exemplary embodiment of the present invention.

Referring to FIG. 3, at least one of the molybdenum-based metal such as molybdenum (Mo) and the molybdenum alloy, the chromium-based metal such as chromium (Cr) and a chromium alloy, a titanium-based metal such as titanium (Ti) and a titanium alloy, a tantalum-based metal such as tantalum (Ta) and a tantalum alloy, and a manganese-based metal such as manganese (Mn) and a manganese alloy is deposited on the insulation substrate 110 formed of the transparent glass or plastic, and one selected from an aluminum-based metal such as aluminum and the aluminum alloy, a silver based-metal such as silver (Ag) and the silver alloy, and a copper-based metal such as copper (Cu) and the copper alloy is deposited thereon to form and pattern two layers, thereby forming the gate line 121 including the gate electrode 124. For example, the first layers 121p and 124p may contain titanium and the second layers 121q and 124q may contain copper or the copper alloy.

For example, after the two layers is formed, a photoresist (not illustrated) is deposited and patterned, and thereafter, the first layers 121p and 124p and the second layers 121q and 124q are etched together by using the patterned photoresist (not illustrated) as a mask. In this case, as an etchant, one that can etch both the first layers 121p and 124p and the second layers 121q and 124q may be used.

Figure 4:
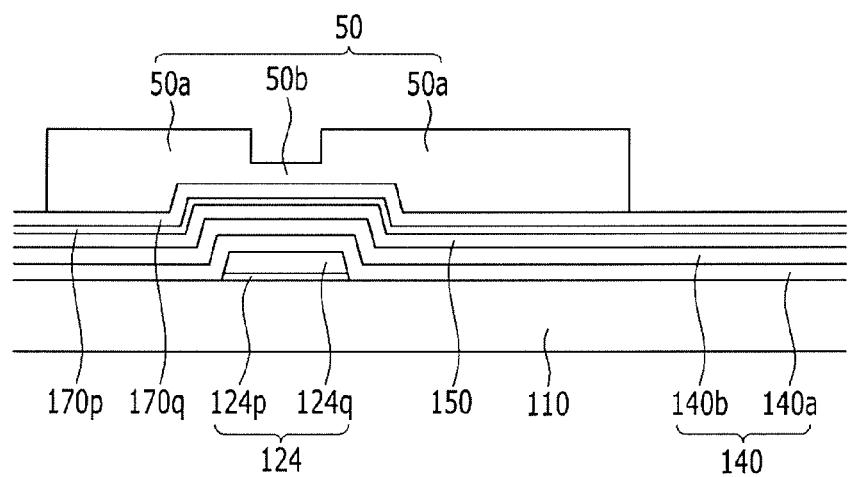

Referring to FIG. 4, the gate insulating layer 140, an oxide layer 150, a metal oxide layer 170p, and a metal layer 170q are deposited on the gate line 121 and the gate electrode 124. In the gate insulating layer 140, the first insulating layer 140a containing a silicon nitride may be deposited, and then the second insulating layer 140b containing a silicon oxide may be deposited.

The oxide layer 150 may contain at least one of zinc (Zn), indium (In), tin (Sn), gallium (Ga), and hafnium (Hf), the metal oxide layer 170p may contain one of an indium-zinc oxide, a gallium-zinc oxide, and an aluminum-zinc oxide, and the metal layer 170q may contain copper or a copper alloy. A photoresist is formed and patterned to form a first photoresist pattern 50 thereon. The first photoresist pattern 50 has a thick first region 50a and a relatively thin second region 50b. A difference in thickness of the first photoresist pattern 50 may be formed by controlling the amount of irradiated light with a mask or by using a reflow method. When the amount of light is controlled, a slit pattern, a lattice pattern, or a semitransparent layer may be formed on the mask. The thin second region 50b corresponds to a position where the channel region of the thin film transistor is to be formed.

Figure 5:
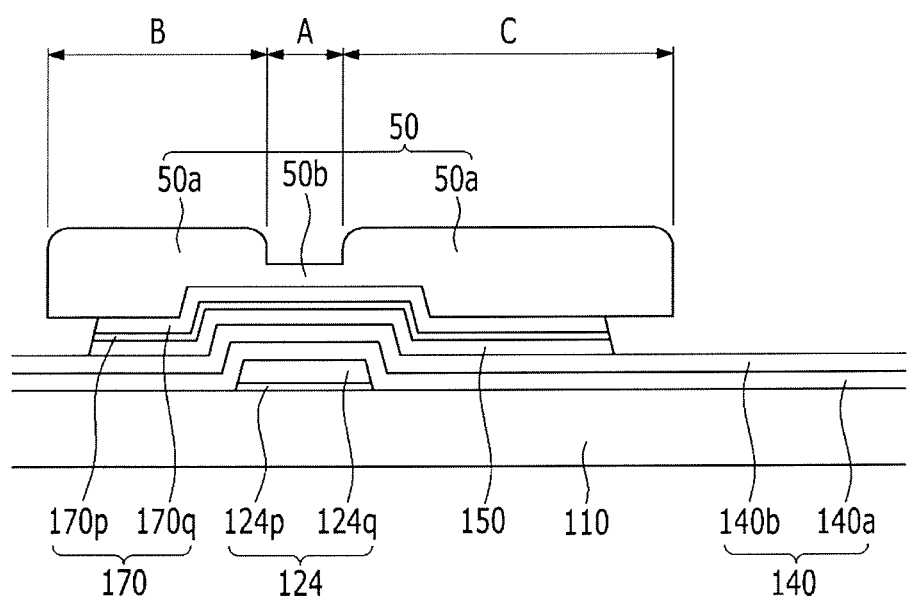

Referring to FIG. 5, the metal oxide layer 170p and the metal layer 170q are etched by using an etchant that may etch both the metal oxide layer 170p and the metal layer 170q by using the first photoresist pattern 50 as a mask. The etchant used herein may be the same as the etchant used when etching the first layers 121p and 124p and the second layers 121q and 124q of the gate line 121.

If the metal oxide layer 170p and the metal layer 170q are etched, lateral surfaces of the metal oxide layer 170p and the metal layer 170q covered with the first photoresist pattern 50 are also etched by the etchant, and as a result, a boundary line of the first metal layer 170p and the second metal layer 170q is positioned inside regions A, B, and C where the first photoresist pattern 50 is formed.

In this case, the etchant that etches the metal oxide layer 170p and the metal layer 170q does not etch the gate insulating layer 140 and the oxide layer 150.

Additionally, the oxide layer 150 is etched by using the first photoresist pattern 50 as the mask.

Figure 6:
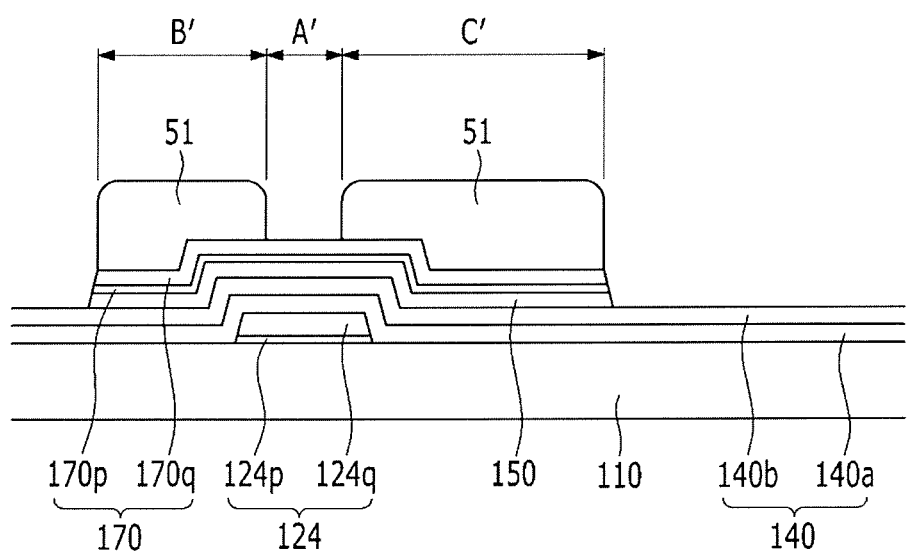

Referring to FIG. 6, the thin second region 50b in FIG. 5 is removed by an etch-back process. In this case, the first region 50a is also etched and thus decreased in width and height to become a second photoresist pattern 51 of FIG. 6. The second photoresist pattern 51 is formed in regions B' and C' which are smaller than the regions B and C where the first photoresist pattern 50 is formed in FIG. 5.

Figure 7:
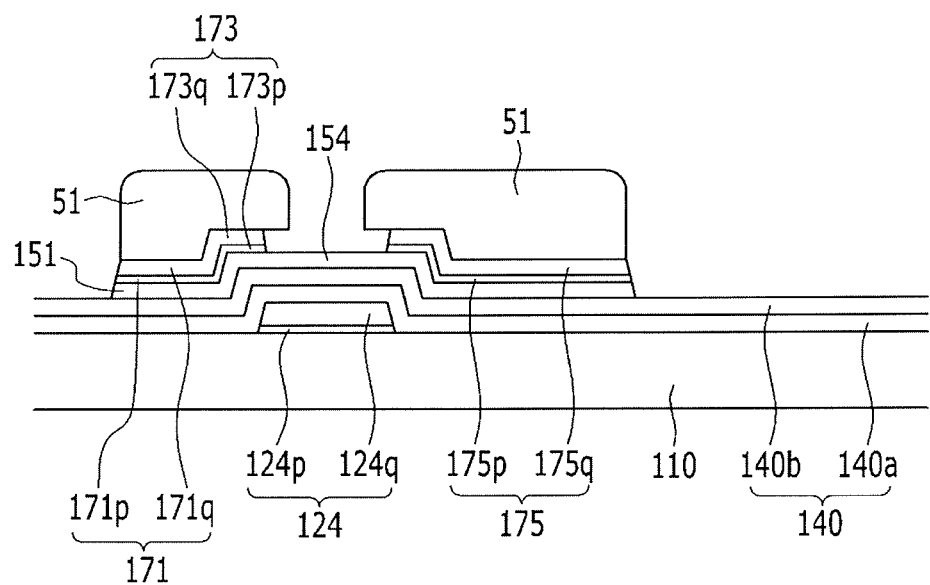

Referring to FIG. 7, the metal oxide layer 170p and the metal layer 170q are etched with an etchant by using the second photoresist pattern 51 as a mask.

In this case, the metal oxide layer 170p and the metal layer 170q are patterned to form the data lines 171p and 171g, the source electrodes 173p and 173q, and the drain electrodes 175p and 175q having a two layered structure. Further, the oxide semiconductor layer 151 includes the projection 154. The projection 154 may serve as a channel region of a thin film transistor.

Using the photoresist patterns having different thicknesses, formed are the semiconductor layers 151 and 154, the barrier layers 171p, 173p, and 175p, the main wiring layers 171q, 173q, and 175q of the data line 171, the source electrode 173, and the drain electrode 175. Since the semiconductor layers 151 and 154, the data line 171, the source electrode 173, and the drain electrode 175 are formed using the photoresist patterns as an etch mask, edges of them are vertically aligned.

Figure 8:
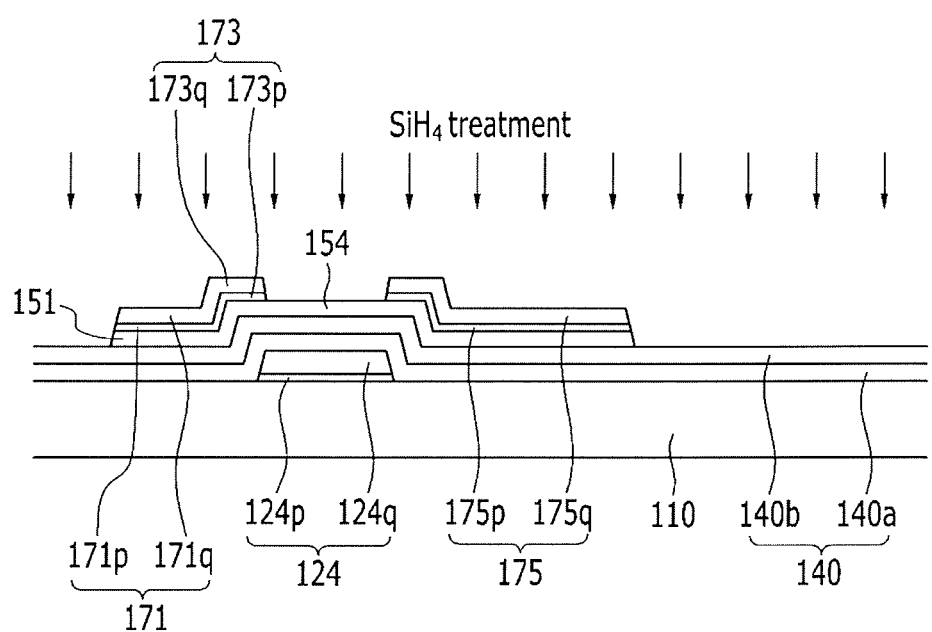

Next, referring to FIG. 8, after the photoresist pattern is removed by an ashing process, the source electrode 173 and the drain electrode 175 are subjected to a silane ($SiH_4$) treatment to form a silane material layer 176. The silane (SiH$_4$) treatment may be performed through a chemical vapor deposition (CVD) process.

Figure 9:
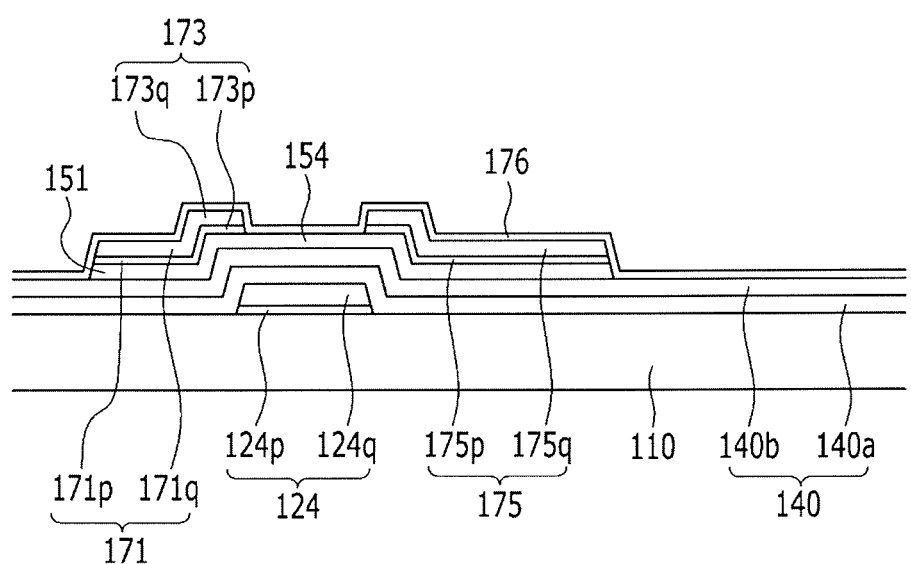

Referring to FIG. 9, a silane material layer 176 is formed along the surface of the source electrode 173 and the drain electrode 175 that are treated with the silane (SiH4). At this time, each lateral surface of the source electrode 173 and the drain electrode 175 near the channel region positioned between the source electrode 173 and the drain electrode 175 is exposed, and the silane material layer 176 is formed on the exposed lateral surfaces of the source electrode and the drain electrode. For example, the exposed lateral surfaces of the source and drain electrodes are covered by the silane material layer 176.

The silane material layer 176 is formed to cover the channel region and the gate insulating layer 140 as well as the surface of the source electrode 173 and the drain electrode 175.

Figure 10:
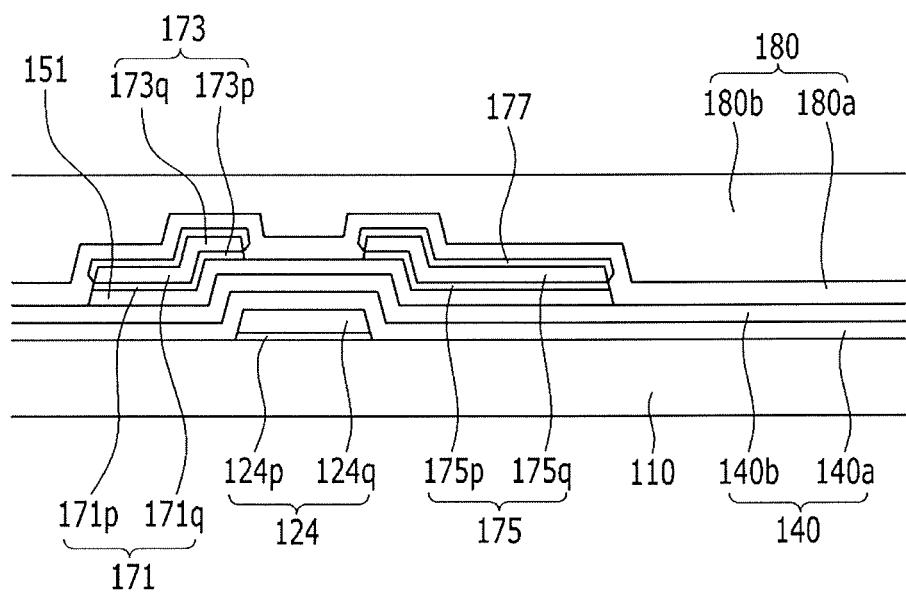

Referring to FIG. 10, the passivation layer 180 is formed on the silane material layer 176. In forming the passivation layer 180, the lower passivation layer 180a containing a silicon oxide may be formed on the silane material layer 176, and the upper passivation layer 180b containing a silicon nitride may be formed on the lower passivation layer 180a. The lower passivation layer 180a including a silicon oxide (SiOx) may be formed by, for example, the reaction of SiH 4 and NO 2. In the process of the lower passivation layer 180a, the silane material layer 176 may react with the copper or copper alloy of the main wiring layers 171q, 173q, and 175q, thereby forming the metal silicide layer 177. Here, the silane material layer 176 may be selectively converted to the metal silicide layer 177 where the silane material layer 176 is in contact with the main wiring layers 171q, 173q, and 175q formed of copper or the copper alloy.

The contact hole 185 exposing a part of the drain electrode 175 is formed by patterning the passivation layer 180, and the pixel electrode 191 is formed on the passivation layer 180 to form the thin film transistor array panel of FIG. 2. In this case, the pixel electrode 191 is formed to be physically connected with the drain electrode 175 through the contact hole 185.

Figure 11:
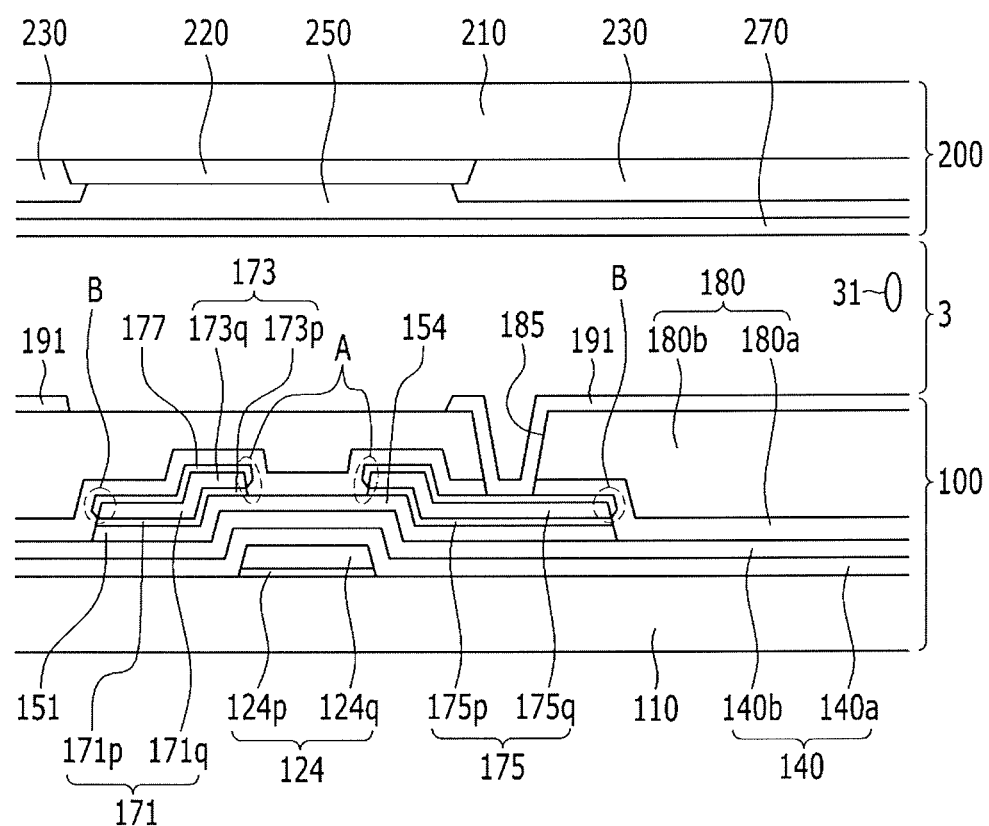
FIG. 11 is a cross-sectional view of a liquid crystal display according to an exemplary embodiment of the present invention.

FIG. 11 is a cross-sectional view illustrating a thin film transistor array panel according to an exemplary embodiment of the present invention.

Referring to FIG. 11, a second substrate 210 faces the insulation substrate 110. The second substrate 210 may be an insulation substrate formed of the transparent glass or plastic. A light blocking member 220 is formed on the second substrate 210. The light blocking member 220 may be formed of a black matrix and serve to prevent light leakage.

Color filters 230 are also formed on the second substrate 210 and the light blocking member 220. The color filters 230 are disposed in a region surrounded by the light blocking member 220, and may be elongated along a column of the pixel electrodes 191. Each color filter 230 may express one of three primary colors such as red, green, and blue. However, the expressed colors are not limited to the three primary colors of red, green, and blue, and each color filter 230 may express one of cyan, magenta, yellow, or white-based colors.

The light blocking member 220 and the color filter 230 are formed on an opposed array panel 200 as described above, however at least one of the light blocking member 220 and the color filter 230 may be formed on the thin film transistor array panel 100.

An overcoat 250 is formed on the color filter 230 and the light blocking member 220. The overcoat 250 may be formed of the insulation material. The overcoat 250 may seal the color filter 230, and may also provide a flat surface. Alternatively, the overcoat 250 may be omitted.

A common electrode 270 is formed on the overcoat 250.

The pixel electrode 191 applied with the data voltage generates an electric field together with the common electrode 270 applied with common voltage to determine a direction of liquid crystal molecules 31 of a liquid crystal layer 3 between the two electrodes. The pixel electrode 191 and the common electrode 270 constitute a capacitor to maintain the applied voltage even after the thin film transistor is turned off.

The pixel electrode 191 overlaps with a storage electrode line (not illustrated) to constitute a storage capacitor, and as a result, voltage storing capability of a liquid crystal capacitor may be increased.

The description of the thin film transistor array panel 100 may be applied with the content of the exemplary embodiment described with reference to FIG. 2.

The thin film transistor array panel according to an exemplary embodiment is not limited to a liquid crystal display, but may be applied to other display systems such as an organic light emitting device.

Figure 12:
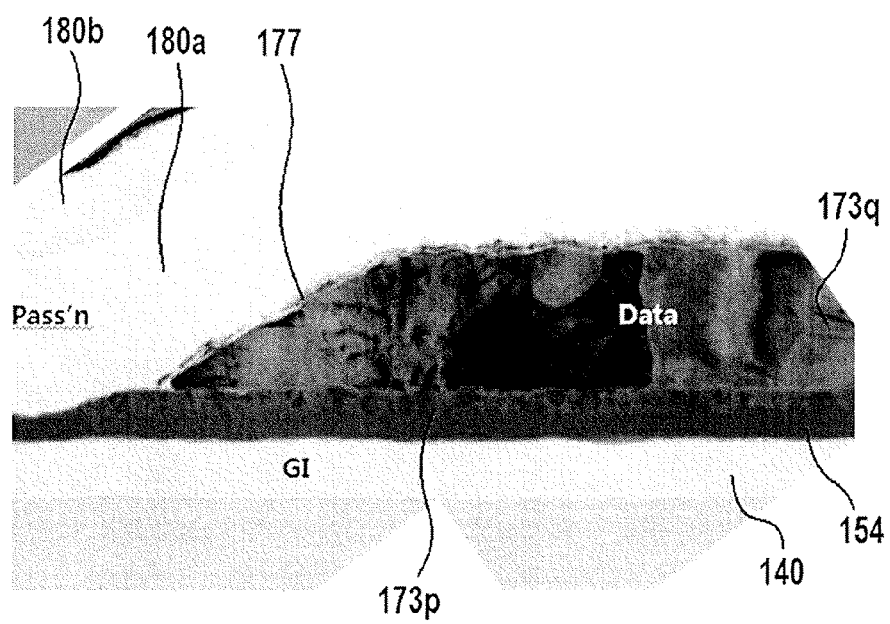
FIG. 12 is a picture of an interface between a main wiring layer and a passivation layer in a thin film transistor array panel according to an exemplary embodiment of the present invention.

FIG. 12 is a picture of an interface between a main wiring layer and a passivation layer in a thin film transistor array panel according to an exemplary embodiment of the present invention.

FIG. 12 is an electronic microscope picture of a thin film transistor array panel according to an exemplary embodiment of the present invention. Referring to FIG. 12, the metal suicide layer 177 is uniformly formed at the interface between the main wiring layer 173q and the lower passivation layer 180a. Also, a pollution source such as a copper oxide is not formed.

Figure 13:
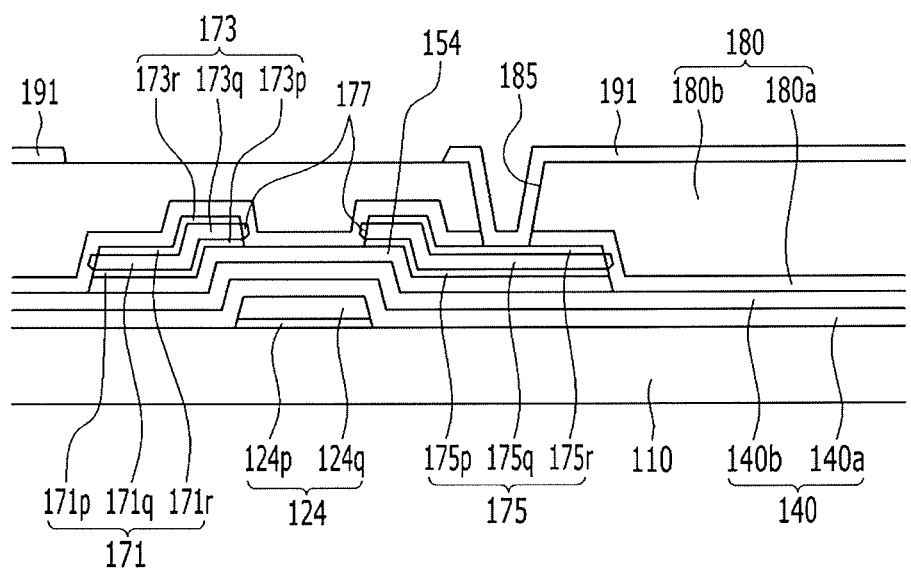
FIG. 13 is a cross-sectional view of a thin film transistor array panel according to an exemplary embodiment of the present invention taken along line II-II of FIG. 1.

FIG. 13 is a cross-sectional view of a thin film transistor array panel according to an exemplary embodiment of the present invention taken along line II-II of FIG. 1. The cross-sectional structure of FIG. 13 is substantially similar to that of FIG. 2, except for the source and drain electrodes 173 and 175. Hereafter, a difference from the exemplary embodiment of FIG. 2 will be described.

Referring to FIG. 13, the data line 171, the source electrode 173, and the drain electrode 175 further include capping layers 171r, 173r, and 175r formed on the main wiring layers 171q, 173q, and 175q. The capping layers 171r, 173r, and 175r include a metal oxide. For example, the capping layers 171r, 173r, and 175r may be formed of at least one of indium-zinc oxide, gallium-zinc oxide, aluminum-zinc oxide, and gallium-zinc oxide. For example, the metal silicide layer 177 is formed only at lateral surfaces of the main wiring layers 171q, 173q, and 175q. The lateral surfaces of the main wiring layers 171q, 173q and 175q are not covered by the barrier layers 171p, 173p, and 175p and the capping layers 171r, 173r, and 175r. For example, the lateral surface of the main wiring layers 171q, 173q and 175q are exposed between the barrier layers 171p, 173p and 175p and the capping layers 171r, 173r and 175r.

Except for the described difference, the content described in FIG. 2 may all be applied to the present exemplary embodiment of FIG. 13.

FIG. 14 to FIG. 20 are cross-sectional views showing a manufacturing method of a thin film transistor array panel according to an exemplary embodiment of the present invention. FIG. 14 to FIG. 20 sequentially show the cross-sectional views taken along line II-II of FIG. 1.

Figure 14:
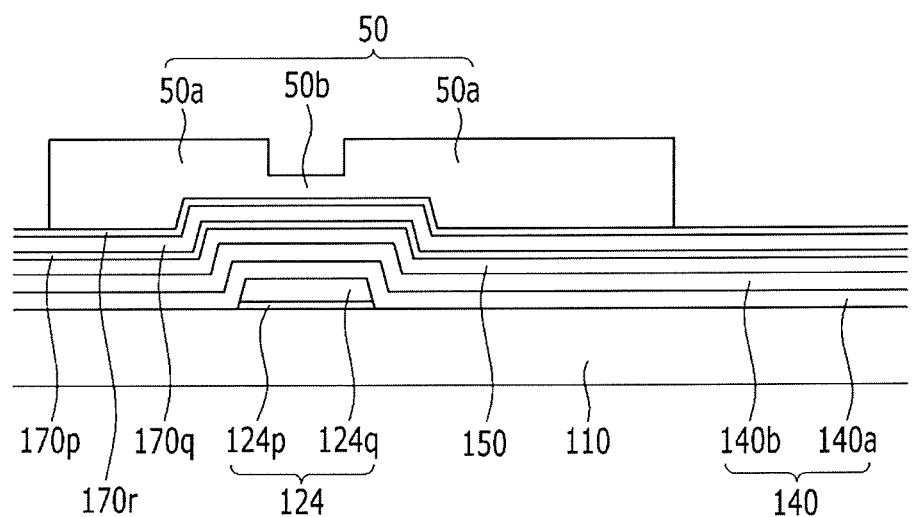
FIG. 14 to FIG. 20 are cross-sectional views showing a manufacturing method of a thin film transistor array panel according to an exemplary embodiment of the present invention.
Figure 15:
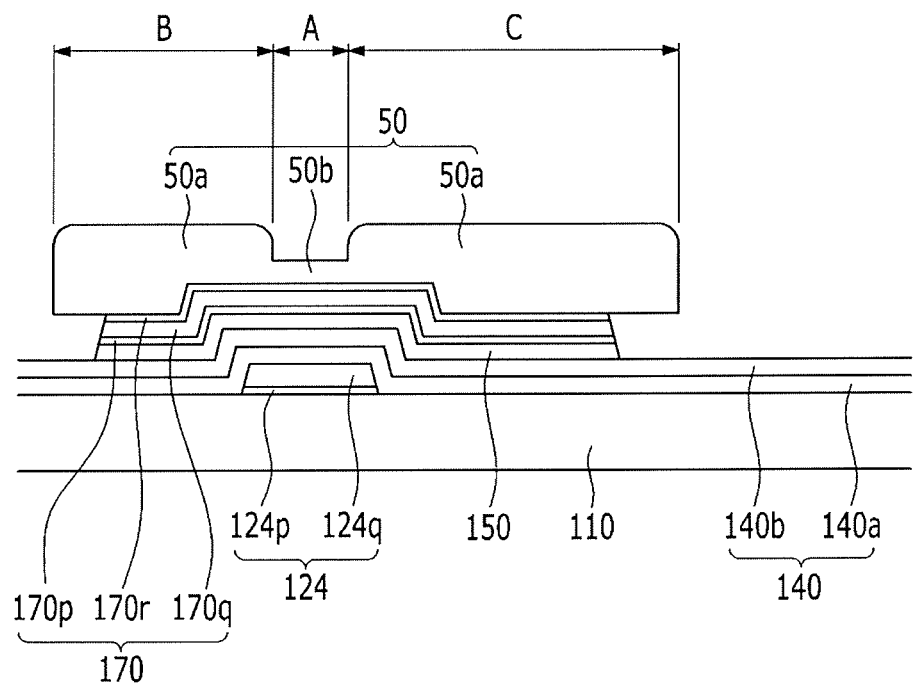
Figure 16:
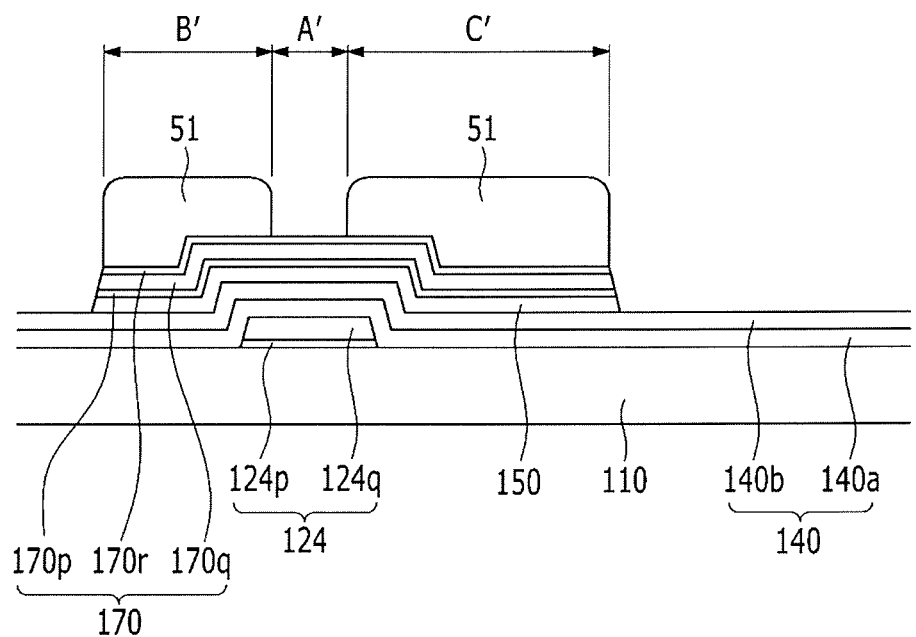
Figure 17:
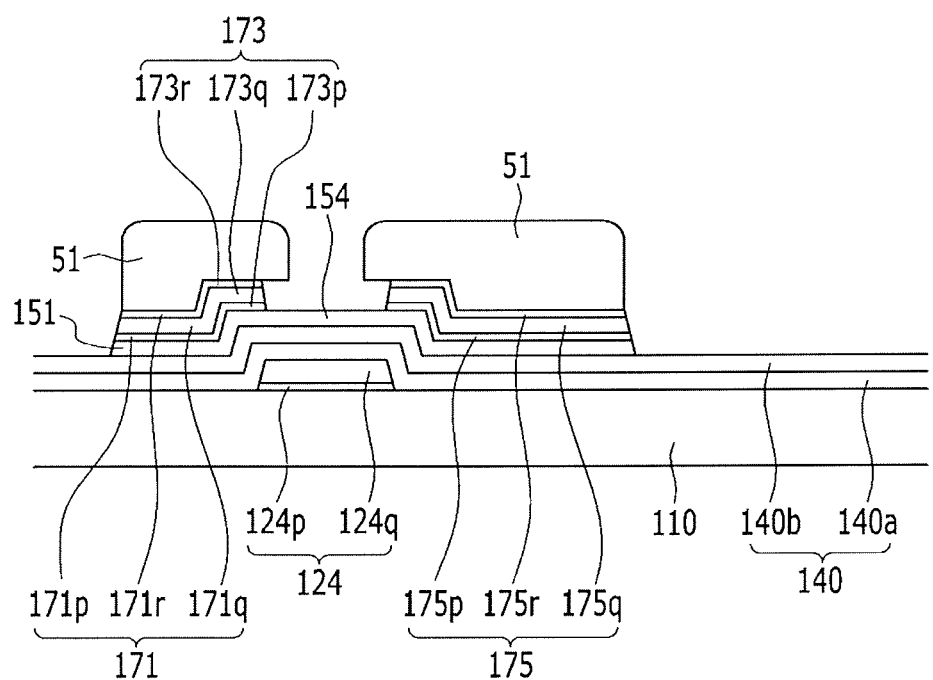

Referring to FIG. 14 to FIG. 19, the manufacturing method of the thin film transistor array panel according to an exemplary embodiment of the present invention is substantially similar to the exemplary embodiment described in FIG. 4 to FIG. 9. Referring to FIG. 14, a metal oxide layer 170r may be additionally formed on the metal layer 170q. In following process, the metal oxide layer 170r is patterned together with the underlying metal layer 170q and the metal oxide layer 170p, as shown in FIG. 17, and thereby the capping layers 171r, 173r, and 175r are formed on the main wiring layers 171q, 173q, and 175q.

Figure 18:
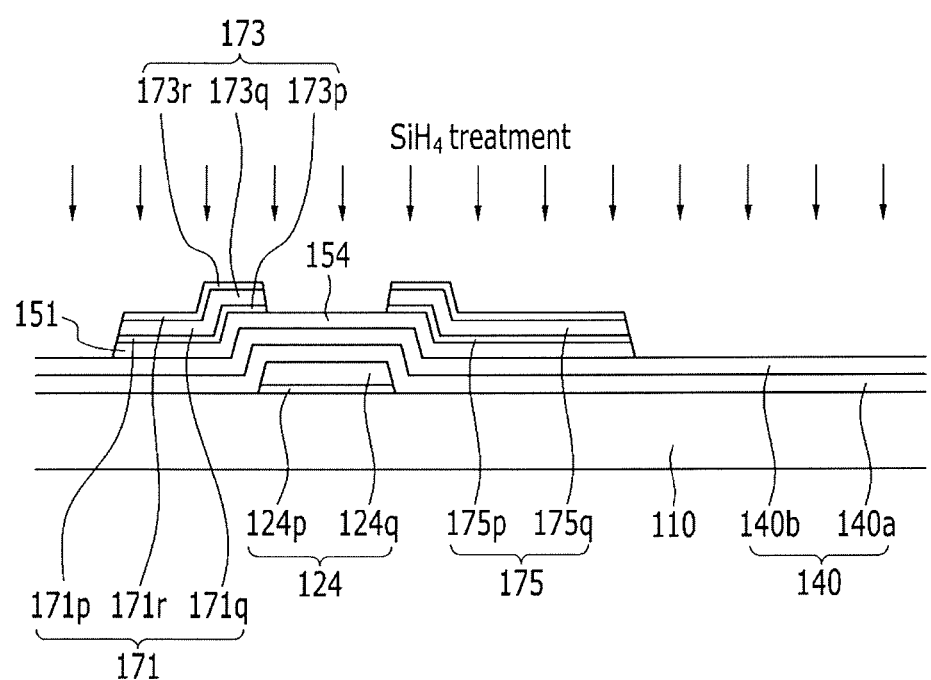

Referring to FIG. 18, after the photoresist pattern is removed by an ashing process, the surfaces of the source electrode 173 and the drain electrode 175 are subjected to a silane ($SiH_4$) treatment to form a silane material layer 176. The silane ($SiH_4$) treatment may be performed through a chemical vapor deposition (CVD) method.

Figure 19:
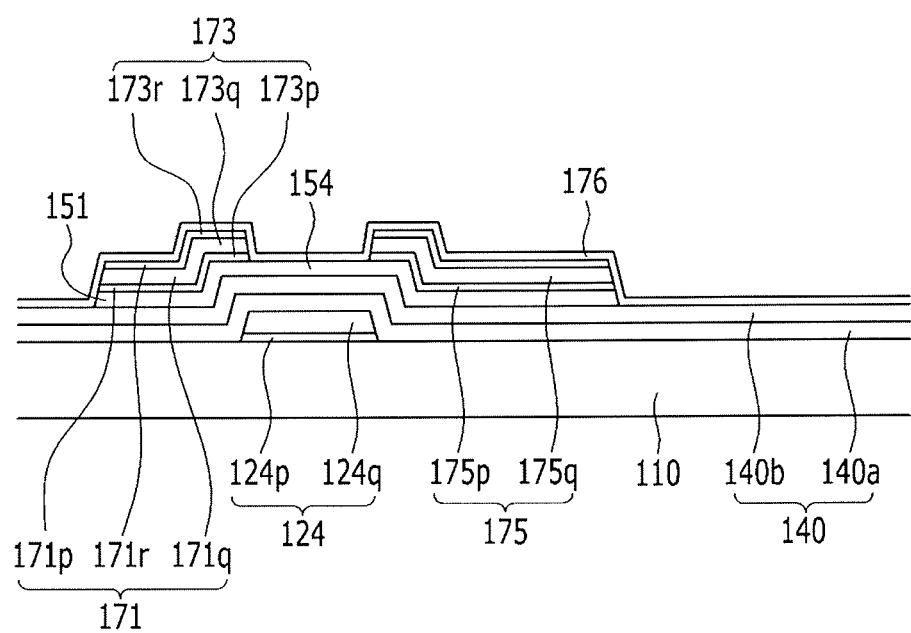

Referring to FIG. 19, the silane material layer 176 is formed along the surface of the source electrode 173 and the drain electrode 175 that is treated with the silane ($SiH_4$). At this time, among each lateral surface of the source electrode 173 and the drain electrode 175 near the channel region positioned between the source electrode 173 and the drain electrode 175, the silane material layer 176 is formed to cover the exposed lateral surfaces of the main wiring layers 171q, 173q, and 175q between the barrier layers 171p, 173p, and 175p and the capping layers 171r, 173r, and 175r. The silane material layer 176 is formed to cover the channel region and the gate insulating layer 140 as well as the surface of the source electrode 173 and the drain electrode 175.

Figure 20:
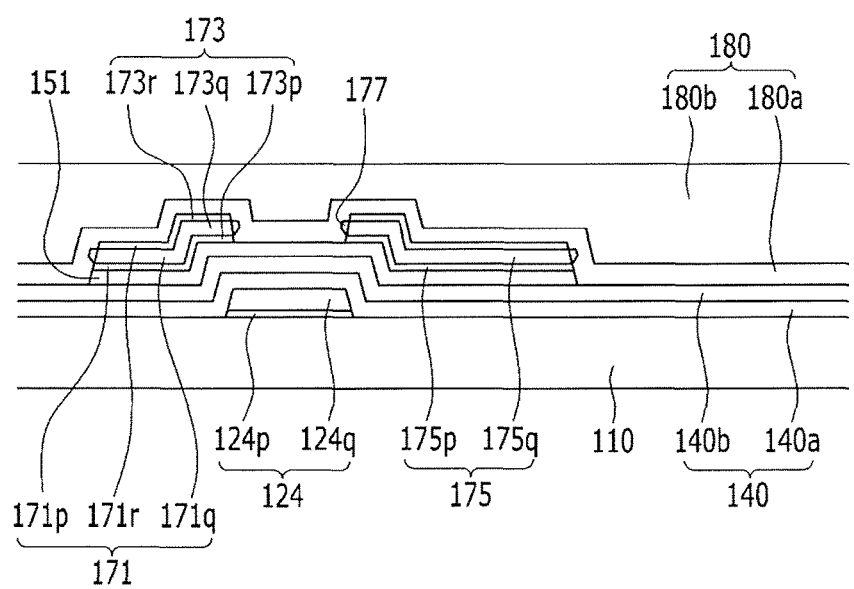

Referring to FIG. 20, a passivation layer 180 is formed on the silane material layer 176. In forming the passivation layer 180, the lower passivation layer 180a containing a silicon oxide may be formed on the silane material layer 176 and the upper passivation layer 180b containing silicon nitride may be formed on the lower passivation layer 180a. The lower passivation layer 180a including silicon oxide ($SiO_x$) may be formed by a reaction of silane ($SiH_4$) and nitrogen dioxide ($NO_2$). In the formation of the lower passivation layer 180a, the silane material layer 176 and the main wiring layers 171q, 173q, and 175q react with each other, thereby forming the metal silicide layer 177. The main wiring layers 171q, 173q, and 175q are formed of copper or the copper alloy. In the formation of the lower passivation layer 180a, silicon of the silane material layer 176 may react with the copper or copper alloy at an interface between the silane material layer 176 and the source electrode 173 and the drain electrode 175.

The contact hole 185 exposing a part of the drain electrode 175 is formed by patterning the passivation layer 180, and the pixel electrode 191 is formed on the passivation layer 180 to form the thin film transistor array panel of FIG. 13. In this case, the pixel electrode 191 is formed to be physically connected with the drain electrode 175 through the contact hole 185.

Figure 21:
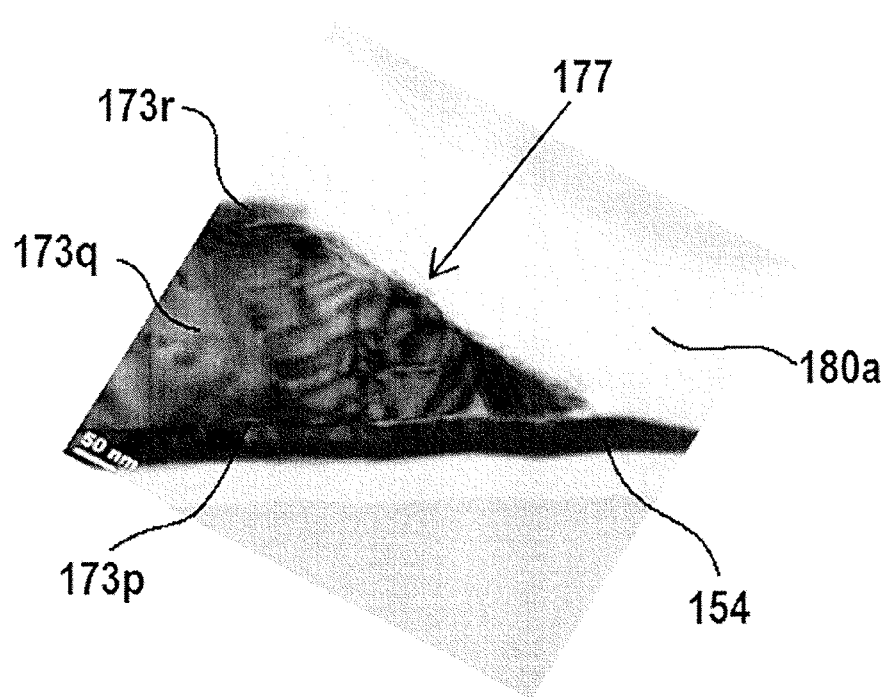
FIG. 21 is a picture of an interface between a main wiring layer and a passivation layer in a thin film transistor array panel according to an exemplary embodiment of the present invention.

FIG. 21 is the picture of an electronic microscope after the thin film transistor array panel according to an exemplary embodiment of the present invention is formed, and referring to FIG. 21, the metal silicide layer 177 is uniformly formed at the interface between the main wiring layer 173q and the lower passivation layer 180a. Also, a pollution source such as a copper oxide is not formed.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. A method of manufacturing a thin film transistor array panel, comprising:
    forming a gate electrode on a substrate;
    forming a semiconductor layer on the substrate and the gate electrode;
    forming a gate insulating layer between the gate electrode and the semiconductor layer;
    forming source and drain electrodes dispose d on first and second sides of the semiconductor layer, respectively, wherein the source and drain electrodes include a metal element;
    forming a silane ($SiH_4$) material layer on the source and drain electrodes; and
    forming a passivation layer on the source and drain electrodes,
    wherein the forming of the passivation layer causes a silicidation process wherein the silicidation process comprises a reaction between silicon of the silane ($SiH_4$) material layer and the metal element of the source and drain electrodes thereby forming a metal silicide layer on first and second lateral sides of the source and drain electrodes, respectively, wherein the first and second lateral sides define a spacing that overlaps the gate electrode, wherein the first and second lateral sides are in direct with the metal silicide layer without being in contact with the passivation layer.

2. The method of claim 1, wherein
    the forming of the silane ($SiH_4$) material layer is performed by a chemical vapor deposition process.

3. The method of claim 2, wherein
    the passivation layer is formed by a reaction of $SiH_4$ and $NO_2$.

4. The method of claim 3, wherein
    the passivation layer is in contact with the semiconductor layer through the spacing defined by the first and second lateral surfaces of the source and drain electrodes.

5. The method of claim 4, wherein
    the forming of the source electrode includes forming a barrier layer on the semiconductor layer and forming a main wiring layer on the barrier layer, and
    the main wiring layer includes copper or a copper alloy and the barrier layer includes a metal oxide.

6. The method of claim 5, wherein
    the forming of the passivation layer includes forming a lower passivation layer and forming an upper passivation layer, wherein the forming of the lower passivation layer causes the silicidation process to occur at an interface between the main wiring layer and the silane ($SiH_4$) material layer, wherein the lower passivation layer includes silicon oxide, and the upper passivation layer includes silicon nitride.

7. The method of claim 6, wherein the metal silicide layer is further disposed on upper surfaces of the source and drain electrodes, wherein the upper surfaces of the source and drain electrodes are not in contact with the passivation layer.

8. The method of claim 5, further comprising forming a capping layer on an upper surface of the main wiring layer, wherein the upper surface of the main wiring layer is not in contact with the passivation layer.

9. The method of claim 1, wherein the semiconductor layer includes an oxide semiconductor.

10. The method of claim 1, wherein the forming of the semiconductor layer and the forming of the source and drain electrodes are performed by using a mask.

* * * * *